United States Patent
Igarashi et al.

(10) Patent No.: US 10,444,626 B2
(45) Date of Patent: Oct. 15, 2019

(54) HOLOGRAM RECORDING COMPOSITION, HOLOGRAM RECORDING MEDIUM, AND METHOD OF PRODUCING HOLOGRAM RECORDING MEDIUM

(71) Applicant: SONY CORPORATION, Tokyo (JP)

(72) Inventors: Eri Igarashi, Kanagawa (JP); Yuko Taki, Tokyo (JP); Hisaya Hara, Kanagawa (JP); Daisuke Hobara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/565,784

(22) PCT Filed: Feb. 1, 2016

(86) PCT No.: PCT/JP2016/000501
§ 371 (c)(1),
(2) Date: Oct. 11, 2017

(87) PCT Pub. No.: WO2016/174798
PCT Pub. Date: Nov. 3, 2016

(65) Prior Publication Data
US 2018/0120694 A1    May 3, 2018

(30) Foreign Application Priority Data
Apr. 27, 2015    (JP) .................. 2015-090647

(51) Int. Cl.
*G03H 1/02* (2006.01)
*G03F 7/028* (2006.01)
(Continued)

(52) U.S. Cl.
CPC ............ *G03F 7/001* (2013.01); *G03F 7/0047* (2013.01); *G03F 7/029* (2013.01); *G03F 7/033* (2013.01);
(Continued)

(58) Field of Classification Search
None
See application file for complete search history.

(56) References Cited

U.S. PATENT DOCUMENTS 6,333,369 B1 * 12/2001 Park .................. C08G 59/4223
                                                  428/413
2002/0142227 A1 * 10/2002 Dhar .................... G03F 7/001
                                                  430/1
(Continued)

FOREIGN PATENT DOCUMENTS

CN    104903797 A    9/2015
DE    112013006348 A    9/2015
(Continued)

OTHER PUBLICATIONS

International Search Report and Written Opinion of PCT Application No. PCT/JP2016/000501, dated May 10, 2016, 10 pages of ISRWO.

*Primary Examiner* — Martin J Angebranndt
(74) *Attorney, Agent, or Firm* — Chip Law Group

(57) ABSTRACT

A hologram recording composition includes at least: a photopolymerizable compound containing at least a first photopolymerizable monomer; binder resin that is inactive to photopolymerization; and a photopolymerization initiator. A change in polarity of the first photopolymerizable monomer by photopolymerization reduces compatibility with the binder resin of the photopolymerizable compound than that before polymerization, the compatibility of the photopolymerizable compound before the polymerization being high.

16 Claims, 1 Drawing Sheet

(51) Int. Cl.
  *G03F 7/035* (2006.01)
  *G03F 7/033* (2006.01)
  *G03F 7/24* (2006.01)
  *G03F 7/00* (2006.01)
  *G03F 7/029* (2006.01)
  *G03F 7/004* (2006.01)
  *G03F 7/038* (2006.01)
  *G11B 7/245* (2006.01)

(52) U.S. Cl.
  CPC .............. *G03F 7/035* (2013.01); *G03F 7/038* (2013.01); *G03H 1/024* (2013.01); *G03H 1/0248* (2013.01); *G03H 1/0272* (2013.01); *G11B 7/245* (2013.01); *G03H 2001/0264* (2013.01); *G03H 2260/12* (2013.01); *G03H 2260/33* (2013.01)

(56) References Cited

U.S. PATENT DOCUMENTS

| | | | | |
|---|---|---|---|---|
| 2003/0129385 | A1* | 7/2003 | Hojo | B29C 59/046 428/323 |
| 2005/0231773 | A1* | 10/2005 | Sasa | C08G 65/18 359/3 |
| 2006/0115740 | A1* | 6/2006 | Hayase | G03F 7/001 430/1 |
| 2007/0013041 | A1* | 1/2007 | Ishigaki | H05K 3/281 257/686 |
| 2009/0091810 | A1* | 4/2009 | Yoshinari | G03F 7/001 359/3 |
| 2010/0039685 | A1* | 2/2010 | Miki | G03H 1/02 359/3 |
| 2010/0221646 | A1* | 9/2010 | Kawamonzen | G03H 1/02 430/2 |
| 2011/0027697 | A1* | 2/2011 | Peredereeva | C08F 2/48 430/2 |
| 2011/0065827 | A1* | 3/2011 | Facke | G03F 7/001 522/173 |
| 2011/0293908 | A1* | 12/2011 | Jeganathan | C09K 9/02 428/211.1 |
| 2012/0234205 | A1* | 9/2012 | Hobbs | C08G 75/12 106/287.26 |
| 2012/0251927 | A1* | 10/2012 | Sasao | G03H 1/02 430/2 |
| 2013/0034805 | A1* | 2/2013 | Hayashida | G03F 7/001 430/2 |
| 2014/0227526 | A1 | 8/2014 | Egawa | |
| 2015/0212487 | A1* | 7/2015 | Azakami | G03H 1/0248 1/248 |

FOREIGN PATENT DOCUMENTS

| | | | | |
|---|---|---|---|---|
| JP | 2006-220689 | A | 8/2006 | |
| JP | 2007-146021 | * | 6/2007 | ............ C08G 59/20 |
| JP | 2008-261928 | * | 10/2008 | ............... G03H 1/02 |
| JP | 2010-122462 | A | 6/2010 | |
| JP | 2012-216267 | A | 11/2012 | |
| JP | 2013-37113 | A | 2/2013 | |
| JP | 2014-146024 | A | 8/2014 | |
| KR | 2015-0103135 | A | 9/2015 | |
| TW | 201243841 | A | 11/2012 | |
| WO | 2008-010521 | * | 1/2008 | ............... G03F 7/029 |
| WO | 2012/137602 | A1 | 10/2012 | |
| WO | 2014/106888 | A1 | 7/2014 | |

\* cited by examiner

HOLOGRAM RECORDING COMPOSITION, HOLOGRAM RECORDING MEDIUM, AND METHOD OF PRODUCING HOLOGRAM RECORDING MEDIUM

CROSS REFERENCE TO RELATED APPLICATIONS

This application is a U.S. National Phase of International Patent Application No. PCT/JP2016/000501 filed on Feb. 1, 2016, which claims priority benefit of Japanese Patent Application No. JP 2015-090647 filed in the Japan Patent Office on Apr. 27, 2015. Each of the above-referenced applications is hereby incorporated herein by reference in its entirety.

TECHNICAL FIELD

The present technology relates to a hologram recording composition, a hologram recording medium, an image display apparatus, and a method of producing the hologram recording medium.

BACKGROUND ART

In recent years, research and development for applying a hologram technology to optical devices and the like are actively performed. Types of the hologram include an emboss type in which interference fringes are recorded as irregularities on a material surface and a volume type in which interference fringes are recorded as refractive index distribution or transmittance distribution.

As a recording material for a volume hologram, a photosensitive composition called a photopolymerization type photopolymer is used (see Patent Literature 1 and Patent Literature 2). In the hologram formation using this photosensitive composition, refractive index distribution corresponding to interference fringes (light and dark) is recorded utilizing the fact that a refractive index difference occurs due to photopolymerization and movement of a monomer accompanying the photopolymerization.

CITATION LIST

Patent Literature

Patent Literature 1: Japanese Patent Application Laid-open No. 2010-134259
Patent Literature 2: Japanese Patent Application Laid-open No. 2013-37113

DISCLOSURE OF INVENTION

Technical Problem

In a hologram recording medium using the photosensitive composition, since the film formed by uniformly mixing each component (a photopolymerizable monomer, binder resin, a photopolymerization initiator, etc.) constituting the photosensitive composition is exposed, components before the exposure having a property of being easily compatible with each other are used.

Meanwhile, after the exposure, since higher Δn (refractive index modulation amount) is given as each component is more separated in the film, it is desirable that each component (at least, the polymer and the binder resin after polymerization of the photopolymerizable monomer) after the exposure has a property of being incompatible with each other or easily susceptible to phase separation, as opposed to before the exposure As described above, since the properties required for each component of the composition before the exposure and each component of the composition after the exposure are contradictory, it is difficult to increase Δn of the photosensitive composition for a hologram recording medium.

Therefore, it is an object of the present technology to provide a hologram recording composition, a hologram recording medium, an image display apparatus, and a method of producing the hologram recording medium that are capable of increasing the amount of refractive index modulation by controlling the compatibility between the components constituting the composition before the exposure and the compatibility between the components constituting the composition after the exposure.

Solution to Problem

In order to solve the above-mentioned problem, the present technology is a hologram recording composition, including at least: a photopolymerizable compound containing at least a first photopolymerizable monomer; binder resin that is inactive to photopolymerization; and a photopolymerization initiator, in which the state of intermolecular interaction of the first photopolymerizable monomer (e.g., at least one of polarity, van der Waals force, hydrogen bonding state, and hydrophobic interaction) changes by photopolymerization, which reduces compatibility with the binder resin of the photopolymerizable compound than that before polymerization, the compatibility of the photopolymerizable compound before the polymerization being high.

The present technology is a hologram recording medium, including: a hologram recording unit including the hologram recording composition.

The present technology is an image display apparatus, including: an optical device including the hologram recording composition, refractive index distribution being formed on the hologram recording composition by irradiating the hologram recording composition with light.

The present technology is a method of producing a hologram recording medium, including: forming a layer of the hologram recording composition according to claim 1; and forming refractive index distribution on the layer of the hologram recording composition by irradiating the layer of the hologram recording composition with light.

Advantageous Effects of Invention

In accordance with the present technology, it is possible to achieve a hologram recording material capable of increasing the amount of refractive index modulation, a hologram recording medium and an image display apparatus using the hologram recording material, and a method of producing the hologram recording medium.

MODE(S) FOR CARRYING OUT THE INVENTION

Figure 1:
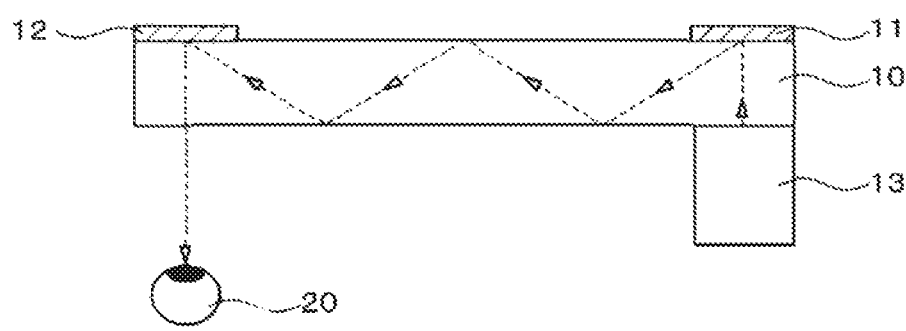
FIG. 1 is a schematic diagram showing an outline of a configuration example of an image display apparatus including a hologram optical device.

Hereinafter, embodiments of the present technology will be described with reference to the drawings. Note that descriptions will be made in the following order.
1. First Embodiment (first example of hologram recording composition)
2. Second Embodiment (second example of hologram recording composition)
3. Third Embodiment (hologram recording medium)
4. Fourth Embodiment (example of image display apparatus)
5. Another embodiment (modified example)

It should be noted that embodiments and the like described below are favorable specific examples of the present technology, and the content of the present technology is not limited to these embodiments and the like. The effects described herein are merely examples and not necessarily limitative, and do not exclude that there are effects different from the exemplified effects.

1. First Embodiment

In a first embodiment of the present technology, a first example of a hologram recording composition will be described. This hologram recording composition is a photosensitive composition including at least a photopolymerizable compound, binder resin, and a photopolymerization initiator.

This hologram recording composition is characterized by the following. That is, when the hologram recording composition is regioselectively irradiated with light, the monomer that is a photopolymerizable compound polymerizes to be a polymer in a bright part, thereby preferentially consuming the monomer, which generates a concentration gradient of the monomer between the bright part and a dark part.

The monomer moves in the direction to eliminate this concentration gradient (in the direction from the dark part to the bright part), and polymerizes in the bright part to be sequentially converted into the polymer. Note that by using a monomer whose compatibility with binder resin changes before and after polymerization, phase separation occurs between the polymer and the binder resin, and the binder resin moves to a region (dark part) where no polymer is present. As a result, the polymer (low refractive index component) is localized in the bright part, and the binder resin (high refractive index component) is localized in the dark part, which makes it possible to express high Δn.

Hereinafter, each component of the hologram recording composition will be described in detail.

(Photopolymerizable Compound)

The photopolymerizable compound contains one or more photopolymerizable monomers, and the compatibility thereof with the binder resin changes before and after photopolymerization. As types of polymerization, cationic polymerization or anionic polymerization is favorable. Note that it does not deny that the type of polymerization is radical polymerization.

It is favorable that this photopolymerizable compound has such a property that the compatibility with the binder resin is high in the state of the monomer before photopolymerization and low in the state of the polymer after photopolymerization.

Note that in the case where it is possible to achieve a mixed state in which the photopolymerizable compound is uniformly (including substantially uniformly) dispersed in the binder resin by mixing, it can be said that "the compatibility between the binder resin and the photopolymerizable compound is high". For example, by using a highly polar photopolymerizable monomer and highly polar binder resin, it is possible to enhance the compatibility between the binder resin and the photopolymerizable compound before polymerization in the state before exposure.

(First Photopolymerizable Monomer)

As a first photopolymerizable monomer contained in the photopolymerizable compound, those in which the state of intermolecular interaction of the first photopolymerizable monomer (e.g., at least one of polarity, van der Waals force, hydrogen bonding state, and hydrophobic interaction) changes by polymerization can be used. As the first photopolymerizable monomer contained in the photopolymerizable compound, for example, those having a smaller dipole moment than the monomer before polymerization in which the polarity changes by polymerization are preferred. This is because the compatibility with the binder resin can be controlled so that the compatibility with the highly polar binder resin is high in the state of the monomer before photopolymerization and the compatibility with the highly polar binder resin is low in the state of the polymer after photopolymerization.

Note that in the case where in the repeating unit of the polymer after polymerization of the first photopolymerizable monomer, the value of the dipole moment of the structural portion corresponding to the photopolymerizable monomer is smaller than the value of the dipole moment of the photopolymerizable monomer, it can be said that "the dipole moment becomes, by polymerization, smaller than that of the monomer before polymerization". The value of the dipole moment can be obtained, for example, by electronic calculation using a PM3 method with semi empirical quantum mechanical calculation software MOPAC. As the first photopolymerizable monomer, for example, one in which the value of the dipole moment is reduced due to polymerization by not less than 1.7 [debye] than that of the monomer before polymerization is favorable.

Examples of such a first photopolymerizable monomer include a photopolymerizable monomer containing a group represented by a general formula (1). Note that any photopolymerizable monomer containing a group represented by the general formula (1) can be used.

[Chem. 1]

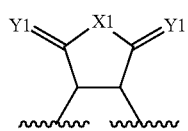

(1)

(in the formula, x1 represents —NH—, —S—, or —O—. Y1 represents =S or =O.)

Examples of the photopolymerizable monomer containing a group represented by the general formula (1) include a compound containing an aromatic compound cyclic group or an aliphatic hydrocarbon group to which a group represented by the general formula (1) is bonded, and a derivative of this compound. More specifically, for example, examples of the photopolymerizable monomer containing a group represented by the general formula (1) include phthalic anhydride, a derivative of phthalic anhydride, or cationically polymerizable or anionically polymerizable monomer such as 2,3-naphthalenedicarboxylic anhydride and a derivative of 2,3-naphthalenedicarboxylic anhydride. Note that any photopolymerizable monomer can be used as long as it contains a group represented by the general formula (1).

(Second Photopolymerizable Monomer)

The photopolymerizable compound typically contains, for example, one or more other photopolymerizable monomers that copolymerize with the above-mentioned photopolymerizable monomer. As the other photopolymerizable monomer, a photopolymerizable monomer containing an epoxy group, and the like can be used as a second photopolymerizable monomer.

Examples of the photopolymerizable monomer containing an epoxy group include a cationic polymerizable or anionic polymerizable monomer such as butyl glycidyl ether. Note that any photopolymerizable monomer can be used as long as it contains an epoxy group.

(Polymerization Reaction)

An example of a polymerization reaction in the case of using phthalic anhydride (first photopolymerizable monomer) and butyl glycidyl ether (second photopolymerizable monomer) as the photopolymerizable compound will be described.

By light irradiation (interference exposure), a polymerization reaction shown in the following reaction formula occurs. At this time, in the polymer after polymerization, the dipole moment of the structural portion corresponding to the first photopolymerizable monomer surrounded by dotted lines, which is the repeating unit, is smaller than the dipole moment of the first photopolymerizable monomer before polymerization (before polymerization (calculated value): 5.67 [debye], after polymerization (calculated value): 2.47 [debye], difference: 3.2 [debye]). As a result, the photopolymerizable compound has high compatibility with the highly polar binder resin in the state before polymerization, and low compatibility with the highly polar binder resin in the state after polymerization. Therefore, the polymer is localized in the bright part, and the binder resin is localized in the dark part, which makes it possible to express high Δn.

[Chem. 2]

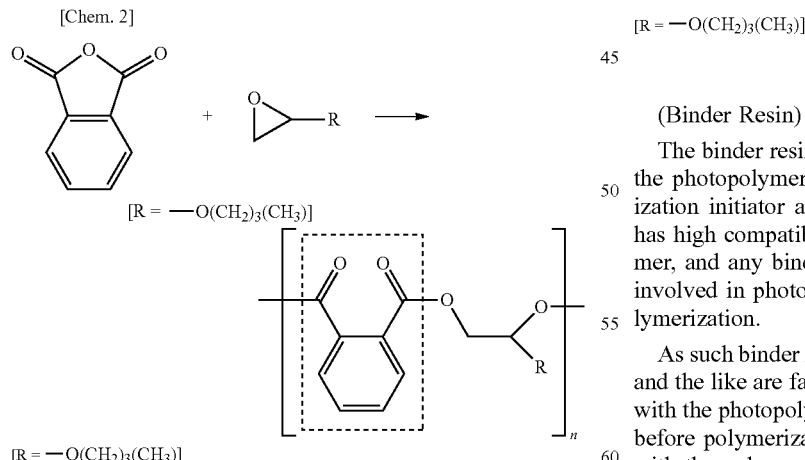

Similarly, an example of a polymerization reaction in the case of using 2,3-naphthalene dicarboxylic anhydride (first photopolymerizable monomer) and butyl glycidyl ether (second photopolymerizable monomer) as the photopolymerizable compound will be described.

By light irradiation (interference exposure), a polymerization reaction shown in the following reaction formula occurs. At this time, in the polymer after polymerization, the dipole moment of the structural portion corresponding to the first photopolymerizable monomer surrounded by dotted lines, which is the repeating unit, is smaller than the dipole moment of the first photopolymerizable monomer before polymerization (before polymerization (calculated value): 8.32 [debye], after polymerization (calculated value): 6.62 [debye], difference: 1.7 [debye]). As a result, the photopolymerizable compound has high compatibility with the highly polar binder resin in the state before polymerization, and low compatibility with the highly polar binder resin in the state after polymerization. Therefore, the polymer is localized in the bright part, and the binder resin is localized in the dark part, which makes it possible to express high Δn.

[Chem. 3]

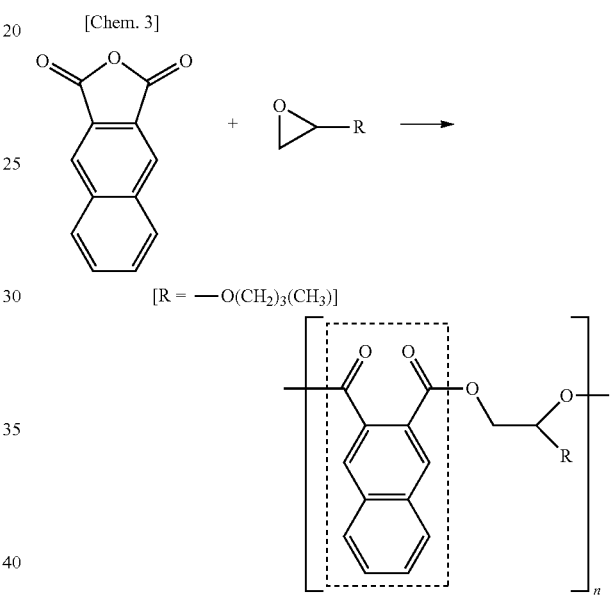

(Binder Resin)

The binder resin is a matrix polymer compound in which the photopolymerizable compound and the photopolymerization initiator are uniformly dispersed. The binder resin has high compatibility with the photopolymerizable monomer, and any binder resin can be used as long as it is not involved in photopolymerization, i.e., inactive to photopolymerization.

As such binder resin, those having a hydrophilic structure, and the like are favorable. This is because the compatibility with the photopolymerizable monomer having high polarity before polymerization becomes high and the compatibility with the polymer having low polarity after polymerization becomes low.

Examples of the hydrophilic structure include an amide structure represented by the following formula (A), a melamine structure represented by the following formula (B), and a phenol structure represented by the following formula (C).

[Chem. 4]

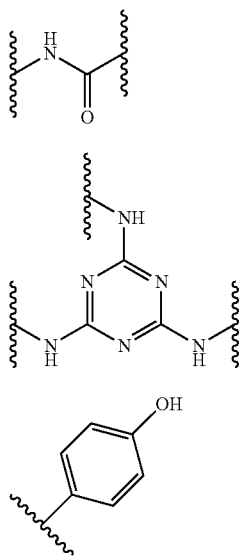

(Photopolymerization Initiator)

Any known photopolymerization initiator can be used. As the photopolymerization initiator, for example, a cationic polymerization initiator, an anionic polymerization initiator, a radical polymerization initiator, and the like can be appropriately selected and used. As the cationic polymerization initiator, for example, 4-isopropyl-4'-methyldiphenyliodonium tetrakis (pentafluorophenyl) borate or the like can be used.

Although the hologram recording composition according to the first embodiment of the present technology contains, as a basic composition, the above-mentioned photopolymerizable compound, binder resin, and photopolymerization initiator, the hologram recording composition may contain other materials as necessary.

2. Second Embodiment

In a second embodiment of the present technology, a second example of the hologram recording composition will be described. The hologram recording composition contains at least the photopolymerizable compound, the binder resin, the photopolymerization initiator, and inorganic fine particles. Note that this hologram recording composition is similar to the hologram recording composition according to the first embodiment except that it contains inorganic fine particles.

This hologram recording composition is characterized by the following. That is, when the hologram recording composition is regioselectively irradiated with light, the monomer that is a photopolymerizable compound polymerizes to be a polymer in a bright part, thereby preferentially consuming the monomer, which generates a concentration gradient of the monomer between the bright part and a dark part.

The monomer moves in the direction to eliminate this concentration gradient (in the direction from the dark part to the bright part), and polymerizes in the bright part to be sequentially converted into the polymer. Note that by using a monomer whose compatibility with binder resin changes before and after polymerization, phase separation occurs between the polymer and the binder resin, and the binder resin moves to a region (dark part) where no polymer is present. As a result, the polymer (low refractive index component) is localized in the bright part, and the binder resin (high refractive index component) is localized in the dark part, which makes it possible to express high Δn. Further, since the hologram recording composition contains inorganic fine particles which are compatible with the photopolymerizable compound and the binder resin and phase-separate from the polymer, it is possible to further increase the refractive index of the dark part, and give higher Δn, by localizing the inorganic fine particles (high refractive index component) together with the binder resin (high refractive index component) in the dark part.

Hereinafter, each component of the hologram recording composition of the present technology will be described in detail.

(Photopolymerizable Compound and Binder Resin)

The photopolymerizable compound and the binder resin similar to those in the first embodiment can be used.

(Inorganic Fine Particles)

As the inorganic fine particles, metal oxide fine particles, metal hydroxide fine particles, and the like can be used. Note that those subjected to a surface treatment or the like with a surface treatment agent or the like may be used. Examples of the metal oxide fine particles include oxide fine particles of a group 4 element such as titanium (Ti) and zirconium (Zr).

As the inorganic fine particles, those containing ligands on surfaces of the inorganic fine particles are favorable. Localization of the inorganic fine particles can be smoothly promoted by selectively arranging appropriate ligands on the surfaces of the inorganic fine particles. As such a ligand, a hydrophilic ligand is favorable. This is because by increasing the compatibility with the binder resin having the hydrophilic structure, localization of the inorganic fine particles can be promoted more smoothly.

For example, as the inorganic fine particles, those containing a structure represented by the following formula (2) as a hydrophilic ligand are more favorable.

[Chem. 5]

$$X2\text{-}(CH_2)_n\text{—}Y2) \qquad (2)$$

(in the formula, X2 represents any one of the following (D-1) to (D-26). Y2 represents any one of the following (E-1) to (E-6). n represents an integer.)

[Chem. 6]

 (D-1)

 (D-2)

 (D-3)

 (D-4)

 (D-5)

-continued

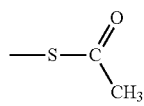 (D-6)

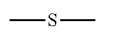 (D-7)

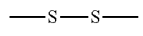 (D-8)

 (D-9)

 (D-10)

 (D-11)

 (D-12)

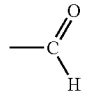 (D-13)

 (D-14)

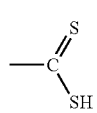 (D-15)

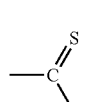 (D-16)

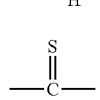 (D-17)

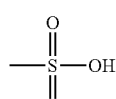 (D-18)

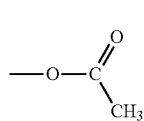 (D-19)

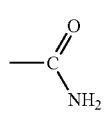 (D-20)

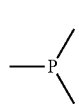 (D-21)

 (D-22)

 (D-23)

 (D-24)

 (D-25)

 (D-26)

[Chem. 7]

—NH₂ (E-1)

—OH (E-2)

(with structure —C(=O)OH) (E-3)

(E-4) structure —C(=O)SH (E-5) structure —C(=S)SH (E-6) structure —C(=O)NH₂

(Particle Size of Inorganic Fine Particles)

From the viewpoint of facilitating the localization of the inorganic fine particles more smoothly, it is favorable that the inorganic fine particles have a smaller particle diameter. For example, the inorganic fine particles are favorably nanoparticles, and more favorably have a particle diameter of not more than 20 nm. Note that the term "nanoparticle" refers to fine particles having a particle size of nano size. The nano size typically refers to a size of not more than 100 nm. The particle diameter is, for example, the volume-based average particle diameter D50 measured by a laser diffraction/scattering method.

Although the hologram recording composition according to the first embodiment of the present technology contains, as a basic composition, a photopolymerizable compound, binder resin, a photopolymerization initiator, and inorganic fine particles, the hologram recording composition may contain other materials as necessary.

3. Third Embodiment

In a third embodiment, a hologram recording medium using the hologram recording composition according to the first embodiment or the second embodiment will be described. This hologram recording medium has a structure in which a hologram recording layer to be a hologram recording unit, and a substrate and at least one of different layers are laminated as necessary. Examples of the different layers include a protective layer, an adhesive layer, a reflective layer, and an antireflection layer. The hologram recording layer is formed of the hologram recording composition according to the first or second embodiment.

In the hologram recording medium, interference fringes are recorded with refractive index distribution by, for example, performing two-beam exposure on the hologram recording layer. In this hologram recording medium, since the hologram recording layer is formed of the hologram recording composition according to the first or second embodiment, high Δn can be achieved.

(Method of Producing Hologram Recording Medium)

An example of a method of producing a hologram recording medium will be described. First, a hologram recording layer (hologram recording composition film) is formed by coating the hologram recording composition according to the first or second embodiment on a substrate and drying it.

Next, a transparent substrate such as a glass substrate is pressure-bonded to the surface of the hologram recording layer formed on the substrate. Thus, a hologram recording medium can be obtained.

(Hologram Recording)

Note that two-beam exposure using a semiconductor laser having a wavelength of 457 nm, for example is performed on this hologram recording medium, and then, UV (ultraviolet rays) is irradiated onto the entire surface of the hologram recording medium to cure the uncured photopolymerizable monomer, thereby fixing the refractive index distribution on the medium. Thus, it is possible to obtain a hologram dry plate having refractive index distribution formed on the hologram recording medium.

4. Fourth Embodiment

In a fourth embodiment, an application example to which the hologram recording composition according to the first embodiment or the second embodiment is applied will be described.

The hologram recording composition according to the first embodiment or the second embodiment is applicable to a hologram optical element (HOE) incorporated in an image display apparatus such as a head-mounted display (HMD) and a head-up display (HUD).

Figure 2:
FIG. 2 is a schematic cross-sectional view showing a configuration of a hologram recording medium prepared in an example.

FIG. 2 schematically shows a configuration example of an image display apparatus. This image display apparatus is incorporated in, for example, an eyeglass-type terminal or the like. The eyeglass-type terminal includes, for example, an eyeglass-type frame to be attached to a user's head, and this image display apparatus is attached to the eyeglass-type frame. The eyeglasses-type terminal may be a binocular type including two image display apparatuses or a single eye type including one image display apparatus. The image display apparatus includes a light-guiding plate 10, a first hologram optical device 11, a second hologram optical device 12, and an image forming device 13.

The light-guiding plate 10 is, for example, a plate-shaped body having a light-transmitting property. This light-guiding plate 10 is disposed, for example, so that the light-guiding plate 10 faces the front of the user's eyes when the user wears the eyeglasses-type terminal. As the light-guiding plate 10, for example, a plate-shaped body formed of a transparent material such as a transparent plastic plate such as polycarbonate resin, a glass plate, and a ceramic plate can be used.

The first hologram optical device 11 having a film-like shape as a first deflection unit and the second hologram optical device 12 having a film-like shape as a second deflection unit are provided at both end portions of the front surface of the light-guiding plate 10. The first hologram optical device 11 diffracts and reflects the light incident on the light-guiding plate 10, and the second hologram optical device 12 diffracts and reflects the light propagated by total reflection inside the light-guiding plate 10 a plurality of times, and emits the light in the direction of a user's eye 20 of the light-guiding plate 10.

The first hologram optical device 11 and the second hologram optical device 12 are, for example, reflection volume hologram diffraction gratings.

Desired optical characteristics are imparted to the first hologram optical device 11 and the second hologram optical device 12 by performing interference exposure on the film of the hologram recording composition according to the first or second embodiment to record the refractive index distribution corresponding to the interference fringe. Since Δn can be improved by using the hologram recording composition according to the first or second embodiment, it is possible to obtain high diffraction efficiency even when the hologram optical device is made thin, and widen the full width at half maximum by making the hologram optical device thin. As a result, visibility of the image can be enhanced in the image display apparatus.

An example of the image forming device 13 has a configuration including a display device such as a liquid crystal display device and an organic EL display device and a collimating optical system. Light emitted from the display device is converted into parallel light by the collimating optical system. Then, this light beam converted into parallel light enters the light-guiding plate 10 as indicated by an arrow in the figure, is guided, and is emitted in the direction of the user's eye 20, and thus, an image is presented.

Another example of the image forming device 13 has a configuration including, for example, a light source formed of a white light emitting device or the like, a collimating optical system for collimating light emitted from the light source, scanning means, and a relay optical system. The scanning means is, for example, MEMS (Micro Electro Mechanical Systems) having micro mirrors rotatable in two dimensions, which horizontally scan and vertically scan incident light.

The light emitted from the light source is made into parallel light by the collimating optical system, horizontal scanning and vertical scanning are performed on the parallel light by the scanning means, and thus, the parallel light is converted into a kind of two-dimensional image, thereby generating virtual pixels. Then, the light from the virtual pixel passes through the relay optical system, the light beam converted into parallel light enters the light-guiding plate 10 as indicated by an arrow in the figure, is guided, and is emitted in the direction of the user's eye 20, and thus, an image is presented.

EXAMPLE

Hereinafter, the present technology will be specifically described by examples, but the present technology is not limited to only these examples.

Example 1

(Hologram Recording Composition)

A hologram recording composition having the following composition was prepared.

Photopolymerizable monomer: 1.0 g of phthalic anhydride (100%), 1.0 g of butyl glycidyl ether (100%)

Binder resin: 1.5 g of urethane acrylate (100%) (U-200AX, Shin-Nakamura Chemical Co., Ltd.)

Photopolymerization initiator (cationic polymerization initiator): 0.05 g of 4-isopropyl-4'-methyldiphenyliodonium tetrakis (pentafluorophenyl) borate powder Solvent: 1.0 g of methylethylketone Mixing time: 12 hours (Hologram Recording Medium)

Next, the above-mentioned hologram recording composition was coated on a 5 μm PVA (polyvinyl alcohol) film with a bar coater so that a dry film thickness is 20 μm, and dried at room temperature for 5 minutes to obtain a resin thin film. The resin surface was pressure-bonded to a 0.7 mm glass substrate to obtain a hologram recording medium having the laminated structure (glass substrate 33/resin thin film 32/PVA film 31) shown in FIG. 2.

(Hologram Dry Plate)

Two-beam exposure using a semiconductor laser having a wavelength of 457 nm was performed on this hologram recording medium, and then, UV (ultraviolet rays) was irradiated onto the entire surface of the hologram recording medium to cure the uncured monomer, thereby fixing the refractive index distribution on the medium. Thus, a hologram dry plate having refractive index distribution formed on the hologram recording medium was obtained.

(Measurement of $\Delta n$)

When $\Delta n$ of the resulting hologram dry plate was measured from the transmittance and the half value of the center wavelength of the transmittance spectrum, $\Delta n=0.02$.

(Calculation of Dipole Moment)

For phthalic anhydride, values of dipole moment before and after polymerization were calculated. The value of the dipole moment was obtained by electronic calculation using a PM3 method with semi empirical quantum mechanical calculation software MOPAC. As a result, the value of dipole moment before polymerization of phthalic anhydride was 5.67 [debye], and the dipole moment of the structural portion corresponding to phthalic anhydride in the repeating unit of the polymer after polymerization was 2.47 [debye].

Example 2

(Hologram Recording Composition)

A hologram recording composition having the following composition was prepared.

Photopolymerizable monomer: 1.0 g of naphthalic anhydride (2,3-naphthalenedicarboxylic anhydride) (100%), 1.0 g of butyl glycidyl ether (100%)

Binder resin: 1.5 g of urethane acrylate (100%) (U-200AX, Shin-Nakamura Chemical Co., Ltd.)

Photopolymerization initiator (cationic polymerization initiator): 0.05 g of 4-isopropyl-4'-methyldiphenyliodonium tetrakis (pentafluorophenyl) borate powder Inorganic fine particles: 0.8 g as titanium fine particle weight of organo-titania sol (Nanotech TiO$_2$ manufactured by CI Kasei Co., Ltd.) having a particle diameter of not more than 20 nm Solvent: 1.0 g of methylethylketone Mixing time: 12 hours (Hologram Recording Medium, Hologram Dry Plate)

Using the above-mentioned hologram recording composition, a hologram recording medium and a hologram dry plate were prepared similarly to Example 1.

(Measurement of $\Delta n$)

When $\Delta n$ of the resulting hologram dry plate was measured from the transmittance and the half value of the center wavelength of the transmittance spectrum, $\Delta n=0.025$.

(Calculation of Dipole Moment)

For naphthalic anhydride, values of dipole moment before and after polymerization were calculated by a method similar to that in Example 1. As a result, the value of dipole moment before polymerization of naphthalic anhydride was 8.32 [debye], and the dipole moment of the structural portion corresponding to phthalic anhydride in the repeating unit of the polymer after polymerization was 6.62 [debye].

Comparative Example 1

A hologram recording composition having the following composition was prepared. Note that this hologram recording composition is similar to the hologram recording composition of Example 1 except that phthalic anhydride is not used as the photopolymerizable monomer and the amount of butyl glycidyl ether is changed to 2.0 g.

Photopolymerizable monomer: 2.0 g of butyl glycidyl ether (100%)

Binder resin: 1.5 g of urethane acrylate (100%) (U-200AX, Shin-Nakamura Chemical Co., Ltd.)

Photopolymerization initiator (cationic polymerization initiator): 0.05 g of 4-isopropyl-4'-methyldiphenyliodonium tetrakis (pentafluorophenyl) borate powder Solvent: 1.0 g of methylethylketone Mixing time: 12 hours (Hologram Recording Medium, Hologram Dry Plate)

Using the above-mentioned hologram recording composition, a hologram recording medium and a hologram dry plate were prepared similarly to Example 1.

(Measurement of $\Delta n$)

When $\Delta n$ of the resulting hologram dry plate was measured from the transmittance and the half value of the center wavelength of the transmittance spectrum, $\Delta n=0.014$.

Comparative Example 2

(Hologram Recording Composition)

A hologram recording composition having the following composition was prepared. Note that this hologram recording composition is similar to the hologram recording composition of Example 2 except that naphthalic anhydride (2,3-naphthalenedicarboxylic anhydride) is not used as the photopolymerizable monomer and the amount of butyl glycidyl ether is changed to 2.0 g.

Photopolymerizable monomer: 2.0 g of butyl glycidyl ether (100%)

Binder resin: 1.5 g of urethane acrylate (100%) (U-200AX, Shin-Nakamura Chemical Co., Ltd.)

Photopolymerization initiator (cationic polymerization initiator): 0.05 g of 4-isopropyl-4'-methyldiphenyliodonium tetrakis (pentafluorophenyl) borate powder Inorganic fine particles: 0.8 g as titanium fine particle weight of organo-titania sol (Nanotech TiO$_2$ manufactured by CI Kasei Co., Ltd.) having a particle diameter of not more than 20 nm Solvent: 1.0 g of methylethylketone Mixing time: 12 hours (Hologram Recording Medium, Hologram Dry Plate)

Using the above-mentioned hologram recording composition, a hologram recording medium and a hologram dry plate were prepared similarly to Example 1.

(Measurement of $\Delta n$)

When $\Delta n$ of the resulting hologram dry plate was measured from the transmittance and the half value of the center wavelength of the transmittance spectrum, $\Delta n=0.02$.

(Evaluation)

In Examples 1 and 2, An could be improved by controlling the compatibility between the components of the composition before and after exposure.

5. Other Embodiments

Although the present technology has been described heretofore by embodiments and examples, the present technology is not limited to the above-mentioned embodiments and examples, and various modifications can be made without departing from the essence of the present technology.

For example, numerical values, structures, shapes, materials, raw materials, production processes, and the like mentioned in the above-mentioned embodiments and examples are merely examples, and different numerical values, structures, shapes, materials, raw materials, production processes, and the like may be used as necessary.

Further, the configurations, methods, steps, shapes, materials, numerical values, and the like of the above-mentioned embodiments and examples can be combined with each other as long as they do not depart from the essence of the present technology.

It should be noted that the present technology may take the following configurations.

[1]
A hologram recording composition, including at least:
a photopolymerizable compound containing at least a first photopolymerizable monomer;
binder resin that is inactive to photopolymerization; and
a photopolymerization initiator, in which
a change in polarity of the first photopolymerizable monomer by photopolymerization reduces compatibility with the binder resin of the photopolymerizable compound than that before polymerization, the compatibility of the photopolymerizable compound before the polymerization being high.

[2]
The hologram recording composition according to [1], in which
a dipole moment of the first photopolymerizable monomer decreases due to the photopolymerization.

[3]
The hologram recording composition according to any one of [1] to [2], in which
the first photopolymerizable monomer is a photopolymerizable monomer containing a group represented by a general formula (1).

[Chem. 8]

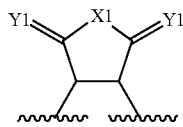
(1)

(in the formula, X1 represents —NH—, —S—, or —O—. Y1 represents =S or =O).

[4]
The hologram recording composition according to [3], in which
the photopolymerizable monomer containing the group represented by the general formula (1) is phthalic anhydride, a derivative of phthalic anhydride, 2,3-naphthalenedicarboxylic anhydride, or a derivative of 2,3-naphthalenedicarboxylic anhydride.

[5]
The hologram recording composition according to any one of [1] to [4], in which
the photopolymerizable compound contains a second photopolymerizable monomer that copolymerizes with the first photopolymerizable monomer.

[6]
The hologram recording composition according to [5], in which
the second photopolymerizable monomer is a photopolymerizable monomer containing an epoxy group.

[7] The hologram recording composition according to any one of [1] to [6], in which
the binder resin has a hydrophilic structure.

[8]
The hologram recording composition according to [7], in which
the hydrophilic structure is represented by a formula (A), a formula (B), or a formula (C)

[Chem. 9]

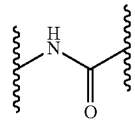
(A)

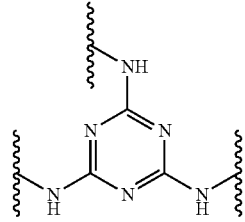
(B)

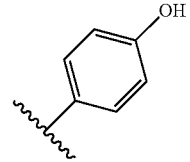
(C)

[9]
The hologram recording composition according to any one of [1] to [8], further including
inorganic fine particles.

[10]
The hologram recording composition according to [9], in which
the inorganic fine particles are oxide fine particles of a group 4 element.

[11]
The hologram recording composition according to [9], in which
the inorganic fine particles contain a hydrophilic ligand on surfaces of the respective inorganic fine particles.

[12]
The hologram recording composition according to [11], in which
the hydrophilic ligand has a structure represented by a general formula (2).

[Chem. 10]

$$X2\text{-}(CH_2)_n\text{-}Y2 \quad (2)$$

(in the formula, X2 represents one of the following (D-1) to (D-26). Y2 represents one of the following (E-1) to (E-6). n represents an integer).

[Chem. 11]

—SH (D-1)

—NH$_2$ (D-2)

—C≡N (D-3)

(D-4) 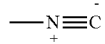

(D-5) 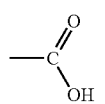

(D-6) 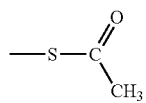

(D-7) 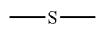

(D-8) 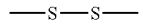

(D-9) 

(D-10) 

(D-11) 

(D-12) 

(D-13) 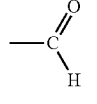

(D-14) 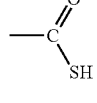

(D-15) 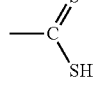

(D-16) 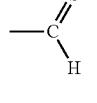

(D-17) 

(D-18) 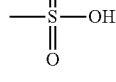

(D-19) 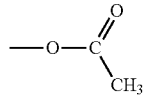

(D-20) 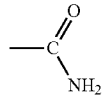

(D-21) 

(D-22) 

(D-23) 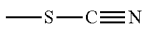

(D-24) 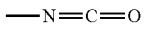

(D-25) 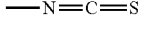

(D-26) 

[Chem. 12]

(E-1) 

(E-2) —OH (E-3) 

(E-4) 

(E-5) 

(E-6) 

[13]
A hologram recording medium, including:
a hologram recording unit including the hologram recording composition according to any one of [1] to [12].

[14]
An image display apparatus, including:
an optical device including the hologram recording composition according to any one of [1] to [12], refractive index distribution being formed on the hologram recording composition by irradiating the hologram recording composition with light.

[15]
A method of producing a hologram recording medium, including:
forming a layer of the hologram recording composition according to any one of [1] to [12]; and
forming refractive index distribution on the layer of the hologram recording composition by irradiating the layer of the hologram recording composition with light.

REFERENCE SIGNS LIST 10 light-guiding plate
11 first hologram optical device
12 second hologram optical device
13 image forming device
20 eye

The invention claimed is:
1. A hologram recording composition, comprising:
a photopolymerizable compound that includes a first photopolymerizable monomer;
a binder resin that is inactive to photopolymerization, wherein the binder resin includes urethane acrylate; and
a photopolymerization initiator, wherein a polarity of the first photopolymerizable monomer changes based on the photopolymerization, compatibility of the first photopolymerizable monomer with the binder resin changes based on the change in the polarity of the first photopolymerizable monomer, the change in the compatibility of the first photopolymerizable monomer with the binder resin facilitates a phase separation between the photopolymerizable compound and the binder resin, the compatibility of the first photopolymerizable monomer with the binder resin before the photopolymerization of the first photopolymerizable monomer is higher than the compatibility of the first photopolymerizable monomer with the binder resin after the photopolymerization of the first photopolymerizable monomer, and a dipole moment of the first photopolymerizable monomer after the photopolymerization is reduced by not less than 1.7 [debye] than the dipole moment of the first photopolymerizable monomer before the photopolymerization.

2. The hologram recording composition according to claim 1, wherein the first photopolymerizable monomer contains a group represented by a formula (1):

[Chem. 1]

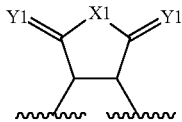

(1)

where X1 represents one of —NH—, —S—, or —O— and Y1 represents one of =S or =O.

3. The hologram recording composition according to claim 2, wherein the first photopolymerizable monomer is one of phthalic anhydride, naphthalic anhydride, or a derivative of naphthalic anhydride that includes 2,3-naphthalenedicarboxylic anhydride.

4. The hologram recording composition according to claim 1, wherein the photopolymerizable compound further includes a second photopolymerizable monomer that copolymerizes with the first photopolymerizable monomer.

5. The hologram recording composition according to claim 4, wherein the second photopolymerizable monomer includes an epoxy group.

6. The hologram recording composition according to claim 1, wherein the binder resin has a hydrophilic structure.

7. The hologram recording composition according to claim 6, wherein the hydrophilic structure is represented by one of a formula (A), a formula (B), or a formula (C)

[Chem. 2]

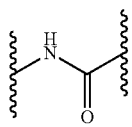

(A)

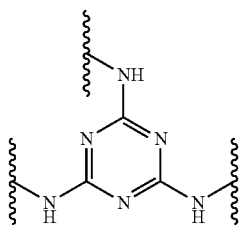

(B)

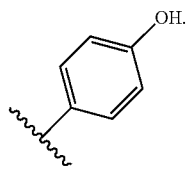

(C)

8. The hologram recording composition according to claim 1, further comprising inorganic fine particles.

9. The hologram recording composition according to claim 8, wherein the inorganic fine particles include oxide fine particles of a group 4 element.

10. The hologram recording composition according to claim 8, wherein the inorganic fine particles contain a hydrophilic ligand on surfaces of respective inorganic fine particles.

11. The hologram recording composition according to claim 10, wherein the hydrophilic ligand has a structure represented by a formula (2):

[Chem.3]

$$X2\text{-}(CH_2)_n\text{—}Y2 \quad (2)$$

where X2 represents one of the following (D-1) to (D-26), Y2 represents one of the following (E-1) to (E-6), and n represents an integer

[Chem.4]

[Chem. 4]

—SH (D-1)

—NH$_2$ (D-2)

—C≡N (D-3)

—N≡C (D-4)

 (D-5)

—S—C(=O)—CH$_3$ (D-6)

—S— (D-7)

—S—S— (D-8)

—OH (D-9)

-continued

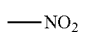 (D-10)

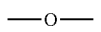 (D-11)

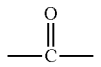 (D-12)

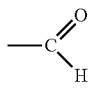 (D-13)

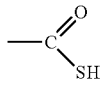 (D-14)

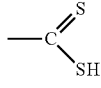 (D-15)

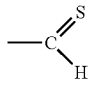 (D-16)

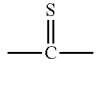 (D-17)

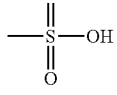 (D-18)

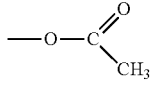 (D-19)

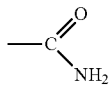 (D-20)

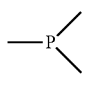 (D-21)

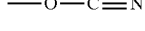 (D-22)

 (D-23)

 (D-24)

 (D-25)

 (D-26)

[Chem. 5]

 (E-1)

 (E-2)

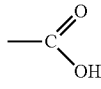 (E-3)

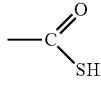 (E-4)

-continued

 (E-5)

 (E-6)

12. The hologram recording composition according to claim 8, wherein a particle diameter of each of the inorganic fine particles is less than or equal to 20 nm.

13. The hologram recording composition according to claim 1, wherein
the phase separation between the photopolymerizable compound and the binder resin corresponds to localization of the photopolymerizable compound in a bright part and localization of the binder resin in a dark part, and
each of the localization of the photopolymerizable compound in the bright part and the localization of the binder resin in the dark part is based on regioselective irradiation of light on the hologram recording composition.

14. A hologram recording medium, comprising:
a hologram recording unit that includes a hologram recording composition,
wherein the hologram recording composition includes:
a photopolymerizable compound that includes a first photopolymerizable monomer;
a binder resin that is inactive to photopolymerization, wherein the binder resin includes urethane acrylate; and
a photopolymerization initiator, wherein
a polarity of the first photopolymerizable monomer changes based on the photopolymerization,
compatibility of the first photopolymerizable monomer with the binder resin changes based on the change in the polarity of the first photopolymerizable monomer,
the change in the compatibility of the first photopolymerizable monomer with the binder resin facilitates a phase separation between the photopolymerizable compound and the binder resin,
the compatibility of the first photopolymerizable monomer with the binder resin before the photopolymerization of the first photopolymerizable monomer is higher than the compatibility of the first photopolymerizable monomer with the binder resin after the photopolymerization of the first photopolymerizable monomer, and
a dipole moment of the first photopolymerizable monomer after the photopolymerization is reduced by not less than 1.7 [debye] than the dipole moment of the first photopolymerizable monomer before the photopolymerization.

15. An image display apparatus, comprising:
an optical device that includes a hologram recording composition, wherein the hologram recording composition includes:
a photopolymerizable compound that includes a first photopolymerizable monomer;

a binder resin that is inactive to photopolymerization, wherein the binder resin includes urethane acrylate; and a photopolymerization initiator, wherein a polarity of the first photopolymerizable monomer changes based on the photopolymerization, compatibility of the first photopolymerizable monomer with the binder resin changes based on the change in the polarity of the first photopolymerizable monomer, the change in the compatibility of the first photopolymerizable monomer with the binder resin facilitates a phase separation between the photopolymerizable compound and the binder resin, the compatibility of the first photopolymerizable monomer with the binder resin before the photopolymerization of the first photopolymerizable monomer is higher than the compatibility of the first photopolymerizable monomer with the binder resin after the photopolymerization of the first photopolymerizable monomer, refractive index distribution of the hologram recording composition is set based on irradiation of light on the hologram recording composition, and a dipole moment of the first photopolymerizable monomer after the photopolymerization is reduced by not less than 1.7 [debye] than the dipole moment of the first photopolymerizable monomer before the photopolymerization.

16. A method of manufacturing a hologram recording medium, comprising:

forming a layer of a hologram recording composition, wherein the hologram recording composition includes:

a photopolymerizable compound that includes a first photopolymerizable monomer;

a binder resin that is inactive to photopolymerization, wherein the binder resin includes urethane acrylate; and a photopolymerization initiator, wherein a polarity of the first photopolymerizable monomer changes based on the photopolymerization, compatibility of the first photopolymerizable monomer with the binder resin changes based on the change in the polarity of the first photopolymerizable monomer, the change in the compatibility of the first photopolymerizable monomer with the binder resin facilitates a phase separation between the photopolymerizable compound and the binder resin, the compatibility of the first photopolymerizable monomer with the binder resin before the photopolymerization of the first photopolymerizable monomer is higher than the compatibility of the first photopolymerizable monomer with the binder resin after the photopolymerization of the first photopolymerizable monomer, and a dipole moment of the first photopolymerizable monomer after the photopolymerization is reduced by not less than 1.7 [debye] than the dipole moment of the first photopolymerizable monomer before the photopolymerization; and setting refractive index distribution of the layer of the hologram recording composition by irradiating the layer of the hologram recording composition with light.

* * * * *